US 6,683,451 B1
United States Patent
Moore et al.

(10) Patent No.: US 6,683,451 B1
(45) Date of Patent: Jan. 27, 2004

(54) MAGNETIC RESONANCE FORCE MICROSCOPE FOR THE STUDY OF BIOLOGICAL SYSTEMS

(75) Inventors: Gregory J. Moore, Bloomfield Hills, MI (US); Stanley T. Fricke, Grosse Pointe Park, MI (US)

(73) Assignee: Wayne State University, Detroit, MI (US)

( * ) Notice: Subject to any disclaimer, the term of this patent is extended or adjusted under 35 U.S.C. 154(b) by 0 days.

(21) Appl. No.: 09/678,425

(22) Filed: Oct. 2, 2000

Related U.S. Application Data (60) Provisional application No. 60/156,843, filed on Sep. 30, 1999.

(51) Int. Cl.[7] .................................................. G01V 3/00
(52) U.S. Cl. ......................... 324/218; 324/309; 324/307
(58) Field of Search ................................. 324/307, 309, 324/318, 300, 310; 73/105; 250/360

(56) References Cited

U.S. PATENT DOCUMENTS

| | | | |
|---|---|---|---|
| 5,166,615 A | 11/1992 | Sidles | 324/307 |
| 5,266,896 A | 11/1993 | Rugar et al. | 324/307 |
| 5,585,722 A | 12/1996 | Hosoki et al. | 324/318 |
| 5,619,139 A | 4/1997 | Holczer et al. | 324/318 |
| 5,874,668 A | 2/1999 | Xu et al. | 73/105 |
| 6,181,131 B1 * | 1/2001 | Bruland et al. | 324/300 |

OTHER PUBLICATIONS

Hammel, et al., Sub–surface Imaging with the Magnetic Resonance Force Microscope, *Journal of Low Temperature Physics,* 101:59–69 (1995).

James et al., Gloxy: An Oxygen–Sensitive Coal for Accurate Measurement of Low Oxygen Tensions in Biological Systems, *MRM,* 38:48–58 (1997).

Rugar, et al., Improved Fiber–Optic Interferometer for Atomic Force Microscopy, *Appl. Phys. Lett.,* 55:2588–2590 (1989).

Zhang, et al., Application of a Novel rf Coil Design to the Magnetic Resonance Force Microscope, *Rev. Sci. Instrum.,* 67:3307–3309 (1996).

Bruland KJ, Krzystek J, Garbini JL, Sidles JA (1995) Anharmonic modulation for noise reduction in magnetic resonance force microscopy. Rev Sci Instrum 66:2853–2856.

Bruland KJ, Garbini JL, Dougherty WM, Sidles JA (1996) Optimal control of force microscope cantilevers. II. Magnetic coupling implementation. J Appl Phys 80:1959–1964.

Cleland AN, Roukes ML (1996) Fabrication of high frequency nanometer scale mechanical resonators from bulk Si crystals. Appl Phys Lett 69:2653–2655.

Dougherty WM, Bruland KJ, Garbini JL, Sidles JA (1996) Detection of AC magnetic signals by parametric mode coupling in a mechanical oscillator. Meas Sci Technol 7:1733–1739.

Garbini JL, Bruland KJ, Dougherty WM, Sidles JA (1996) Optimal control of force microscope cantilevers. I. Controller design. J Appl Phys 80:1951–1958.

(List continued on next page.)

*Primary Examiner*—Diego Gutierrez
*Assistant Examiner*—Brij B. Shrivastav
(74) *Attorney, Agent, or Firm*—Rohm & Monsanto, P.L.C.

(57) ABSTRACT

A high resolution magnetic resonance force microscope is adapted to study biological systems, such as isolated cells, sub-cellular organelles and other sub-cellular structures, or cellular receptors and proteins, at resolutions ranging from 1 micron to 1 Å. The proposed magnetic resonance force microscope allows the direct, non-destructive, chemical specific, three-dimensional imaging of biological systems. In some embodiments, the biological sample may be altered to enhance its ability to be detected by its nuclear or electron spin resonance. In a particularly preferred embodiment, a paramagnetic agent is incorporated into cells by endocytosis.

18 Claims, 8 Drawing Sheets

OTHER PUBLICATIONS

Rugar D, Yannoni CS, Sidles JA (1992) Mechanical detection of magnetic resonance. Nature 360:563–566.

Rugar D, Züger O, Hoen S, et al (1994) Force detection of nuclear magnetic resonance. Science 264:1560–1563.

Sidles JA (1991) Noninductive detection of single–proton magnetic resonance. Appl Phys Lett 58:2854–2856.

Sidles JA (1992) Folded Stern–Gerlach experiment as a means for detecting nuclear magnetic resonance in individual nuclei. Phys Rev Lett 68:1124–1127.

Sidles JA, Garbini JL, Drobny GP (1992) The theory of oscillator–coupled magnetic resonance with potential applications to molecular imaging. Rev Sci Instrum 63:3881–3899.

Sidles JA, Rugar D (1993) Signal–to–noise ratios in inductive and mechanical detection of magnetic resonance. Phys Rev Lett 70:3506–3509.

Sidles JA, Garbini JL, Bruland KJ, et al (1995) Magnetic resonance force microscopy. Rev Mod Phys 67:249–265.

Wago K, Züger O, Kendrick R, et al (1996) Low–temperature magnetic resonance force detection. J Vac Sci Technol B 14:1197–1201.

Wago K, Züger O, Wegener J, et al (1997) Magnetic resonance force detection and spectroscopy of electron spins in phosphorus–doped silicon. Rev Sci Instrum 68:1823–1826.

Yannoni C, Züger O, Rugar D, Sidles JA (1996) Force detection & imaging in magnetic resonance. In Grant DM, Harris RK (eds): Encyclopedia of Nuclear Magnetic Resonance. Chichester NY: Wiley, pp. 2093–2101.

Zhang Z, Hammel PC, Wigen PE (1996) Observation of ferromagnetic resonance in a microscope sample using magnetic resonance force microscopy. Appl Phys Lett 68:2005–2007.

Zhang Z, Roukes ML, Hammel PC (1996) Sensitivity and spatial resolution for electron–spin–resonance detection by magnetic resonance force microscopy. J Appl Phys 80:6931–6938.

Züger O, Rugar D (1993) First images from a magnetic resonance force microscope. Appl Phys Lett 63:2496–2498.

Züger O, Rugar D (1994) Magnetic resonance detection and imaging using force microscope techniques (invited). J Appl Phys 75:6211–6216.

Züger O, Hoen ST, Yannoni CS, Rugar D (1996) Three–dimensional imaging with a nuclear magnetic resonance force microscope. J Appl Phys 79:1881–1884.

* cited by examiner

FIG. 9

MAGNETIC RESONANCE FORCE MICROSCOPE FOR THE STUDY OF BIOLOGICAL SYSTEMS

RELATIONSHIP TO OTHER APPLICATION(S)

This application is a continuation-in-part of provisional application No. 60/156,843 filed on Sep. 30, 1999 and claims the benefit thereof under 35 U.S.C. §119.

GOVERNMENT RIGHTS

This invention was made under contract awarded by the National Institutes of Health, Contract Number RR13411-02. The government has certain rights in the invention.

BACKGROUND OF THE INVENTION

1. Field of the Invention

This invention relates generally to magnetic resonance force microscope, and more particularly, to a magnetic resonance force microscope that is particularly adapted to study biological systems, such as isolated cells, sub-cellular organelles and other sub-cellular structures, or cellular receptors and proteins, at resolutions ranging from 1 micron to 1 Å.

2. Description of the Related Art

Magnetic resonance force microscopy (MRFM) is an emerging technology that combines the strengths of magnetic resonance and force microscopy to achieve high resolution three-dimensional sub-surface imaging of a test substance.

Magnetic resonance imaging (MRI) has had a revolutionary impact on non-invasive imaging for both medical purposes and for microscopic studies of biological systems. However, the relative insensitivity of inductive detection via rf coils prevents conventional MRI techniques from achieving resolution better than 10 microns. Recent theoretical and experimental work has shown that any magnetic resonance experiment, originally performed using conventional inductive techniques, can also be performed using microscale mechanical resonators and the technology of force microscopy. While current inductive detection limits are on the order of about $10^{15}$ nuclear spins, mechanical detection is revolutionary because the theoretical sensitivity is a single nucleon.

To date, both electron and nuclear magnetic resonance signals have been successfully detected by mechanical means, validating the theory of mechanical detection of magnetic resonance. In these early experiments, a microscale force microscope cantilever detects the magnetic force exerted by electron or nuclear moments in the material being observed. The magnetization of the material was modulated by the resonant frequency of the cantilever by standard magnetic resonance techniques.

Currently, several laboratories are developing the technology for application to the study of semiconductor chips and related areas in materials science applications. While researchers have expressed the desirability of imaging biological systems with this technology, there has been no practical reduction to practice of a magnetic resonance force microscope adapted to analyze biological materials.

Nevertheless, the impact of magnetic resonance force microscopy technology on biomedical research and biotechnology would be substantial. For example, an MRFM would be a powerful new probe for use in the fields of pathology and histology. Typically, tissue biopsy samples are prepared for diagnostic evaluation by thinly slicing the sample, followed by numerous staining procedures, and finally by carefully mounting of the samples for optical microscopy. The three-dimensional imaging capability of an MRFM would facilitate the diagnostic process by eliminating the need to thinly slice biopsy samples. In addition, it is anticipated that the chemical specificity of the MRFM technology would allow the evaluation and development of new information on tissue biochemistry without the use of stains. The same capabilities would be extremely useful in the study of cellular and sub-cellular structure and function. Much of the analytical work in this field is also performed with optical microscopy techniques which are limited in their usefulness when studying thick or opaque samples and which are generally not chemical specific.

At the present time the primary tools employed for large biomolecular structure determination are x-ray and neutron crystallography. These probes require large quantities of material in the form of a crystal. Isolating and crystallizing sufficient quantities for obtaining biomolecular structures can be exceptionally time consuming. Months, or even years, may be required to determine such structures. The ability to directly image single-copy molecules by MRFM would dramatically reduce this time and would greatly accelerate the current pace of research.

It is, therefore, an object of this invention to provide a magnetic resonance force microscope specifically adapted to the study of biological systems.

It is another object of this invention to provide a technique for using magnetic resonance force microscopy to perform high resolution, chemical specific imaging of biological systems.

It is also an object of this invention to provide magnetic resonance force microscope and technique for using the same to image biological systems with resolutions of from about 1 micron to several nanometers, and potentially to molecular scale resolution.

SUMMARY OF THE INVENTION

The foregoing and other objects are achieved by this invention which provides in a broad apparatus aspect thereof, an MRFM apparatus for high resolution imaging of samples comprising:

a mechanical oscillator having a natural frequency of oscillation;

a sample containing nuclear or electron spins, in proximity to the mechanical oscillator;

means for applying a large substantially time independent magnetic field gradient to said sample;

means for applying at least one oscillating time dependent magnetic field to said sample;

means for detecting the low amplitude mechanical resonance signals from the sample.

In a preferred embodiment, the MRFM apparatus is adapted to image biological specimens as will be described more completely hereinbelow.

In a particularly preferred method of use, a biological sample is imaged by mechanical detection of magnetic resonance, by the steps of:

placing a sample containing nuclear or electron spins, in proximity to a mechanical oscillator having a natural frequency of oscillation;

applying a large substantially time independent magnetic field gradient to said sample;

applying at least one oscillating time dependent magnetic field to said sample; and detecting the low amplitude mechanical resonance signals from the sample.

Scanning, by moving the sample and/or oscillator relative to one another, produces multi-dimensional images of the biological sample.

In certain embodiments of the invention, the biological specimen is altered to enhance its ability to be detected by the MRFM apparatus of the present invention. In the case of electron spin resonance, the biological specimen is doped with a paramagnetic agent. In the case of NMR imaging, the biological specimen is doped with a NMR visible compound.

BRIEF DESCRIPTION OF THE DRAWING

Comprehension of the invention is facilitated by reading the following detailed description, in conjunction with the annexed drawing, in which.

DETAILED DESCRIPTION

The MRFM is based on the mechanical detection of magnetic resonance signals. The force between the field gradient due to a small permanent magnet and the spin magnetization in the sample is used to drive the oscillation of a high Q, low spring-constant, micromechanical resonator, in one embodiment, a silicon atomic force microscope cantilever. More specifically, the spin magnetization m of a sample is detected by the force $F=(m\cdot\nabla) B$ between m and the magnetic field gradient $\nabla B$ generated by a permanent magnet. This force is measured by laser interferometric detection of the motion of the micromechanical resonator.

The field gradient of the permanent magnet also enables high resolution spatial imaging, as in conventional magnetic resonance imaging (MRI), by allowing identification of the magnetic resonance signals arising from different spatial locations. Spatial resolution $\Delta z$ is determine by the magnitude of the field gradient and the intrinsic linewidth $\Delta B_{1w}$ of the magnetic resonance signal: $\Delta z \approx \Delta B_{1w}/\nabla B$.

Figure 1:
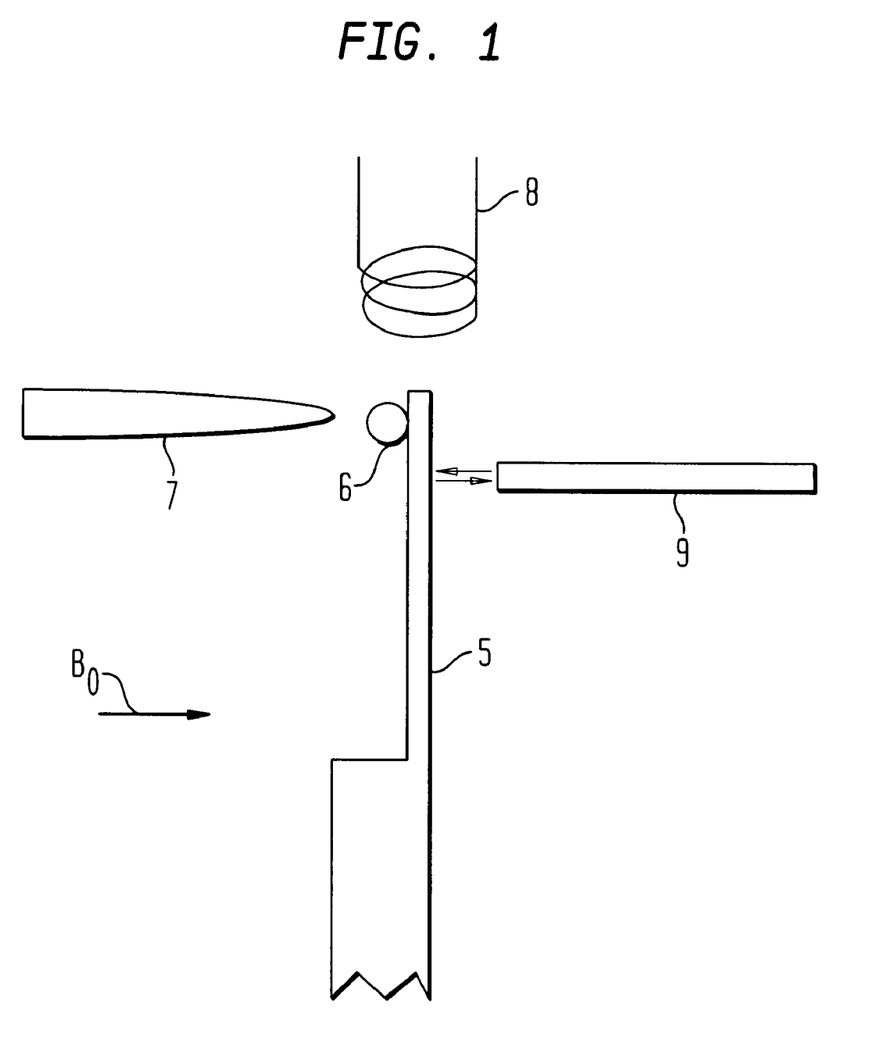
FIG. 1 is a schematic diagram of a MRFM that is illustrative of the principles of magnetic resonance force microscopy.

FIG. 1 is a schematic diagram of a MRFM illustrative of the general principles of magnetic resonance force microscopy. The MRFM 10 of FIG. 1 has a micromechanical resonator, in the form of a cantilever 5. In this embodiment, a sample 6 is mounted on the cantilever. The sample is placed in the field of a permanent magnet 7 mounted on a translatable stage (not shown). An rf field, generated by a nearby coil 8, periodically modulates the force on the cantilever by modulating m, the spin magnetization of the sample. Through a coupling force, $F=(m\cdot\nabla) B$, between the spin magnetization m and a magnetic field gradient of the magnet $\nabla B$, the nuclear magnetization of the sample causes a deflection of the microcantilever. This deflection can be sensed very accurately using fiber optic laser interferometer 9.

As in magnetic resonance imaging, the relationship between magnetic resonance frequency, f, of the spin moment and the applied field B is $f=\gamma B$, where $\gamma$ is the gyromagnetic ratio. This relationship enables the selection of a well-defined volume of nuclear or electronic spin moments which are coupled to the cantilever. The applied field varies with distance from the permanent magnet, so there is a correspondence between location in the sample and f. Only those spins having a resonance frequency $f=\gamma B(z)$ matching the rf frequency are manipulated, so only these spins contribute the time dependent force. This manipulation, by magnetic resonance techniques, is used to produce a periodic force at the characteristic frequency, $f_c$, of the cantilever (~tens of kHz for commercial cantilevers) which drives its oscillation. The oscillation amplitude of the microcantilever is proportional to the magnitude of the force on the cantilever, and so to the spin magnetization within the selected volume. As the microscope is scanned, the variation of oscillation amplitude with position will map out magnetization density. Furthermore, once a volume of spins is selected a wide range of nuclear MRFM experiments can be carried out selectively on that localized volume. The oscillating field can only modify the orientation of the spin magnetization within the selected volume.

The greatly enhanced sensitivity that can be achieved through mechanical detection of magnetic resonance allows the detection of signals from a much smaller number of spins than is possible by conventional inductive detection methods. This enhanced sensitivity allows an increase in the field gradient and, thus, a reduction in the volume of the sample isolated for study (i.e., an improvement in the resolution of the microscopic study) while maintaining adequate signal to noise ratios. Thus, the key to obtaining high spatial resolution is to optimize the sensitivity of the microscope.

Various methods of increasing sensitivity will be described hereinbelow. Two factors which play a key role in determining sensitivity are the temperature T and the magnetic field gradient $|\nabla B|$. A reduced temperature both increases the polarization of the nuclear spins and reduces thermal noise. The magnetic field gradient is important for two reasons. First, it isolates a volume of the sample. Second, the magnetic field gradient plays a unique role essential for mechanical detection of magnetic resonance in that it provides the coupling between the spins and the mechanical resonator.

In one preferred embodiment described hereinbelow, a small magnet, which produces a highly inhomogeneous field, is mounted on the tip of the micromechanical resonator. The design parameters of the micromechanical resonator, for example, its force constant, k, and resonant frequency, $\omega_0$, are also important parameters. The goal is to minimize the number of spins which the instrument can detect, given in terms of a minimum detectable magnetic moment $m_{min}$, or sensitivity, which depends on several parameters including the quality factor Q, the bandwidth $\Delta v$, and Boltzmann's constant $k_b$:

$$m_{\min} = \frac{1}{|\nabla B|}\sqrt{\frac{2kk_BT\Delta v}{Q\omega_0}}$$

Reducing $m_{min}$ will require optimizing all of the variables in this expression. The theoretically achievable limit permits the detection of a single nuclear spin. Current experiments have a achieved a sensitivity of=$1.5\times10^{-17}$ J/T, with the following experimental parameters: k=0.1N/m, T=300K, $|\nabla B|$=60 T/m, $\Delta v$=0.1 Hz, Q=2000, and $\omega_0$=$2\pi\times 8$ kHz. An instrument sufficiently to detect the inversion of a single proton (single proton magnetic moment=$1.4\times10^{-26}$ J/T) would be possible with the following parameters: k=0.01N/m, T=0.45K, $|\nabla B|$=$1\times10^6$ T/m, $\Delta v$=0.1 Hz, $\omega_0$=$1\times10^6$, and $\omega_0$=$2\pi\times 10$ MHz.

In a first practical embodiment of a MRFM of the type shown in FIG. 1, the device had a sensitivity of $3\times10^{11}$ electron spins at room temperature in an applied field ($B_0$) of 253 gauss and a resolution of 1 micron, an order of magnitude improvement over conventional nuclear magnetic resonance (NMR) microscopy resolution. Various techniques for improving the sensitivity of this first practical embodiment, and for adapting the magnetic resonance force microscope for three-dimensional biomolecular imaging, are set forth hereinbelow.

Figure 2:
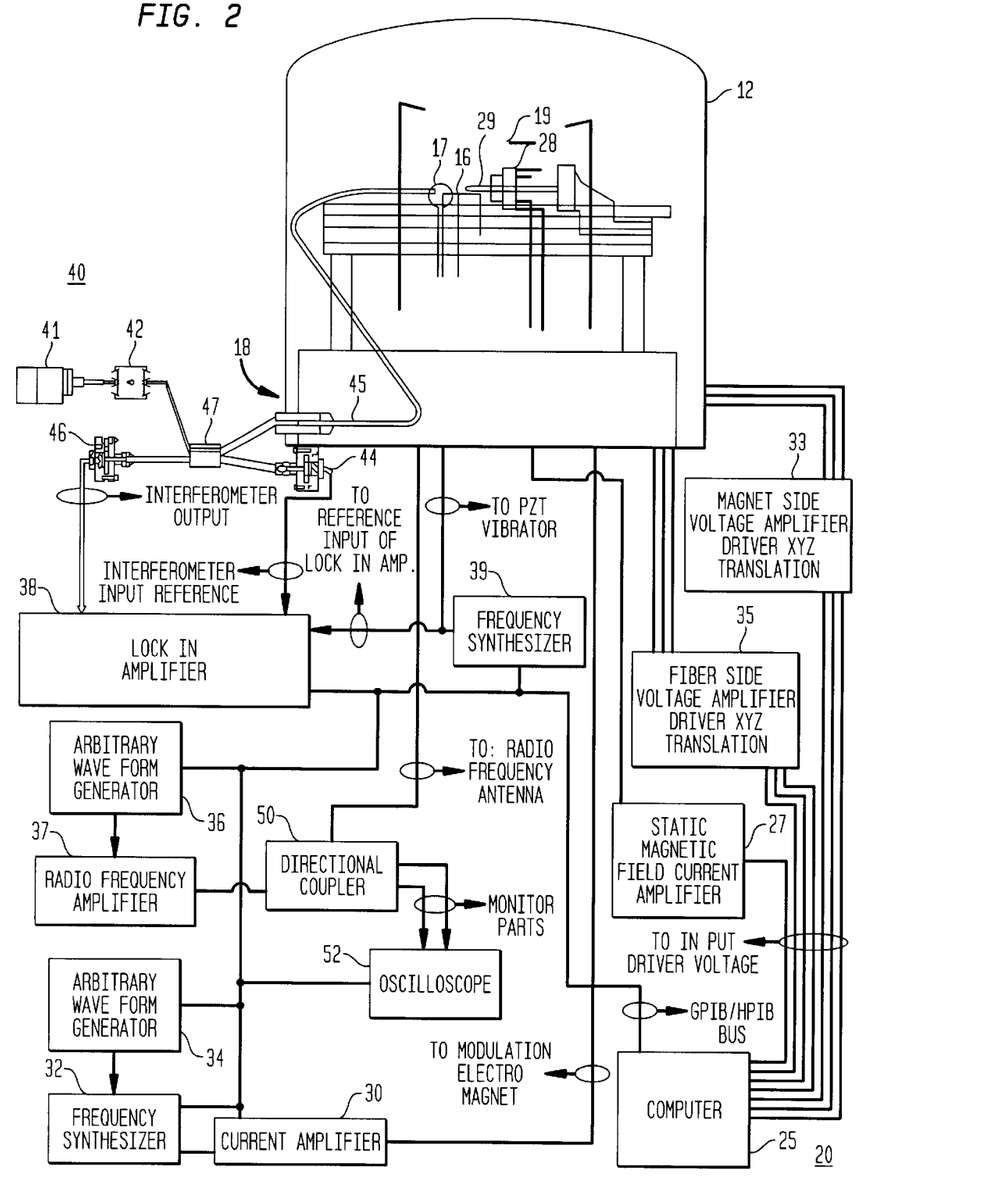
FIG. 2 is a partially schematic and function block representation of a MRFM in accordance with the principles of the invention.

FIG. 2 is a partially schematic and function block representation of a MRFM 20 constructed in accordance with the principles of the invention. As shown in the figure, there is provided a container 12 that provides an evacuated containment region within which is provided, inter alia, a sample, which may be prepared in accordance with the invention, a cantilever 16, an optical fiber vacuum feed-through arrangement that is designated generally as 18 for the interferometric detection system, and a magnetic field-producing arrangement that is designated generally 19. These and other components contained within container 12 will be more readily viewable in subsequent figures.

As shown in FIG. 2, a computer 25 controls the operation of the MRFM. The computer is coupled to a current amplifier 27 that is coupled at its output to an electromagnet 28. Current amplifier 27 operates in combination with a further current amplifier 30 that also is coupled to electromagnet 28. In this specific illustrative embodiment of the invention, electromagnet 28 is formed of two electromagnet windings (of different diameters in this embodiment) that are arranged to surround a permanent magnet 29. Current amplifier 30 is coupled to a frequency synthesizer 32, an arbitrary waveform generator 34, a further arbitrary waveform generator 36, a lock in amplifier 38, and computer 25. Current amplifiers 27 and 30 control the current that is conducted through electromagnet 28. Arbitrary wave form generator 36 is coupled to a radio frequency generator 37, which also is coupled to a directional coupler 50. Radio frequency generator 37 is connected to an rf coil 17 that is a transmitter or receiver. Computer 25 and lock in amplifier 38 are additionally coupled to a frequency synthesizer 39 that is shown to be coupled to the cantilever.

In addition to the foregoing, computer 25 aligns and controls the relative positions of all components of the MRFM system and also receives and processes acquired data. The relative positions of the magnet, cantilever and optical fiber are independently controllable by piezoelectric x,y,z translation stages, or positioners. Suitable translation stages and related high voltage amplifiers for control of positioning and scanning for the cantilever, optical fibers, and/or permanent magnet can be purchased commercially from Burleigh Instruments, Fishers, N.Y. In the MRFM shown in FIG. 2, computer 25 controls the scanning motion of the permanent magnet 29, in one embodiment, through voltage amplifier driver 33. In another embodiment, computer 25 controls the translation of a translatable stage/sample holder through voltage amplifier driver 35.

In this specific illustrative embodiment of the invention, there is additionally provided an optical fiber interferometer, that is generally designated as 40, that will be described in greater detail in connection with FIG. 3, hereinbelow. As will be described therein, the photodiode arrangement is coupled to one port of a 2×2 optical coupler 47. It is coupled at a further port thereof to lock in amplifier 38, which provides feedback at a further photodiode 44 that is responsive to the output of the photodiode arrangement.

A temperature-controlled laser diode 41 provides a stable laser energy to an isolator 42 that is coupled to a port of 2×2 optical coupler 47. The remaining port of 2×2 optical coupler 40 is coupled to vacuum feed-through arrangement 18. An optical fiber 45 couples the 2×2 optical coupler, via vacuum feed-through arrangement 18, to the vicinity of cantilever 16. As described herein, the displacement of cantilever 16 is detected, illustratively by application of any of several known interferometry techniques.

A visual indication of the displacement of the cantilever, which functions as a mechanical oscillator responsive to nuclear or electron spins in the sample, is provided in the display of an oscilloscope 52 that is coupled, in this embodiment, to directional coupler 50, lock in amplifier 38, and computer 25. The directional coupler is coupled to a detector loop 53 disposed in the vicinity of cantilever 16, within container 12.

In certain specific embodiments of the invention, the rf coil (shown as reference numeral 17 in FIG. 2) applies a radio frequency field, B to saturate the electron spin magnetization. In a typical example, a mm size solenoid coil, which is impedance matched to the signal source using conventional resonant circuit techniques is employed. The radio frequency is illustratively between about 500–1000 MHz. In a specific illustrative embodiment, a standard LRC circuit where the coil consists of a single turn of copper wire (4 mm in diameter) attached to a circuit board with the appropriate variable capacitors allows maximal flexibility in apparatus geometry, optimal access for sample changing and stage adjustment/alignment. Of course, other configurations can be employed in the practice of the invention, such as the modified Alderman-Grant coil described in Zhang, et al., "Application of a novel rf coil design to the magnetic resonance force microscope," Rev. Sci. Instrum., Vol. 67, pp. 3307–3309 (1996).

Atomic force cantilevers, suitable for the practice of the invention, may be obtained commercially from Park Scientific and Digital Instruments, Santa Barbara, Calif.; Molecular Imaging, Corporation, Phoenix, Ariz., e.g., Model 65016 CONTR-16 reflex coated contact mode pointprobe silicon AFM-type probe; and Nanosensors, GmbH & Co., Wetzlar-Blankenfeld, Germany. In one practical embodiment, a silicon atomic force microscopy cantilever, clamped at one end only, has dimensions of about 450 microns length, 30–40 microns width, and 1–3 microns thickness, force constants of ~0.08 N/m, and an unloaded resonance frequency of ~6–20 KHz. If the sample is placed on the cantilever, the mass of the sample will reduce the resonant frequency (and, hence, Q). Sensitivity can be increased by employing smaller mechanical resonators (cantilevers) since smaller cantilevers have higher Q's and resonant frequencies, and lower spring constants. It is anticipated that lithography and laser ablation techniques can be used to make small resonators.

The position of the cantilever is detected by means of an ultra-sensitive fiber optic interferometer. In this embodiment, the interferometer is a modification of a design disclosed in Rugar, et al., "Improved fiber-optic interferometer for atomic force microscopy," *Appl. Phys. Lett.*, Vol. 55, pp. 2588–2590 (1989), the disclosure of which is incorporated by reference. Using this interferometer in the MRFM shown in FIG. 2 resulted in a microscope with a resolution of 0.002 Å/√Hz. The sensor is based on the optical interference occurring in a micron-size cavity formed between the cleaved end of a single-mode optical fiber and the cantilever.

Figure 3:
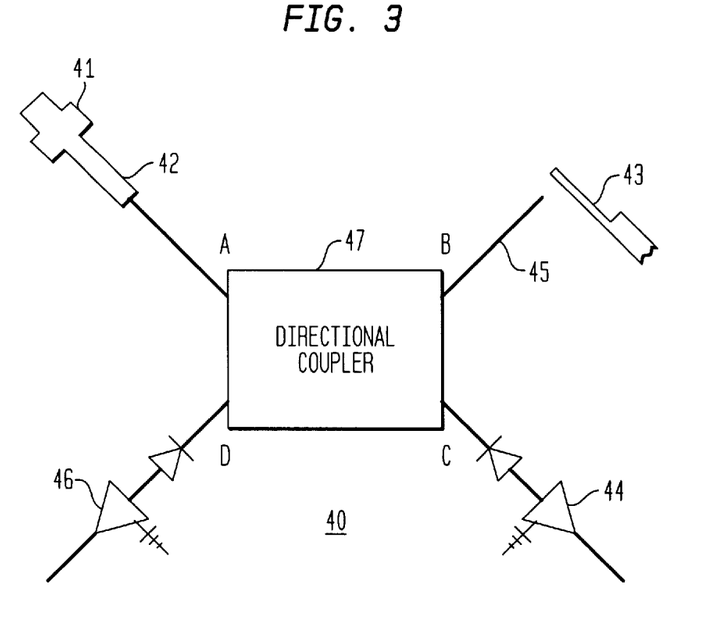
FIG. 3 is a schematic diagram of a fiber optic interferometer useful in the practice of the invention.

A preferred embodiment of a fiber optic interferometer is shown in the diagram of FIG. 3. The fiber optic interferometer preferably has a temperature-controlled and current source-matched laser diode 41 to increase output stability and reduce noise. The laser diode output is first directed into an isolator 42 to minimize light reflections thereby increasing laser diode stability and reducing noise in the system. The output of isolator 42 is directed into input lead A of a 2×2 optical directional coupler 47 that splits the incident optical power between output lead B which carries light to cantilever 43 and output lead C which carries light to a reference photodiode at monitor/feedback port 44. A small percentage of the light in lead B is reflected from the glass-air interface at the cleaved end of the fiber 45. This reflected light comprises one of the two interfering beams (not shown). The remainder of the light in lead B exits fiber 45 and impinges on cantilever 43. Part of the light is scattered back into fiber 45 and interferes with the light reflected from the glass-air interface at the cut end of the fiber. The total optical power reflected back through the fiber depends on the phase difference between the fiber end reflection and the cantilever reflection. The coupler directs a portion of the total reflected light to lead D and into signal photodiode 46 where the intensity of the optical interference is measured. The output of signal photodiode 46 can be used directly as the force microscope signal. Photo diode-amplifier hybrids (photodiodes combined with transimpedance amplifiers) minimize detector noise sources. A low noise version of the hybrid is utilized on the detection side and a high-speed version is used on the monitor/feedback port available from UDT Sensors, Inc., Hawthorne, Calif.

In the interferometer of FIG. 3, the connections are preferably made with "SC" type connectors that are phased and frequency matched to the system. This provides increased signal stability, reduces noise, and provides greater diode output stability due to reduced reflections. As an additional benefit, the "SC" connectors eliminate any contamination in the system by outside light. Illustratively, the "SC" connectors are available from Oz Optics, Corp., Ontario, Canada.

Figure 4A:
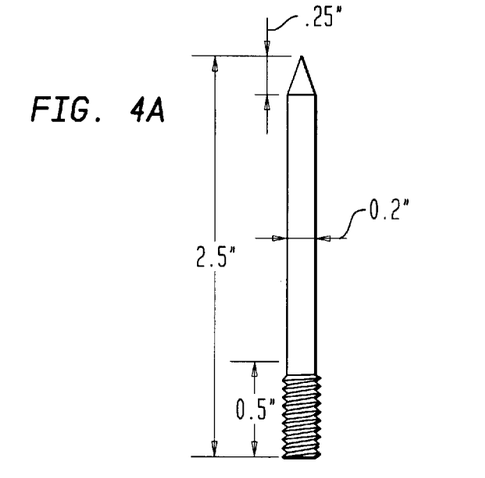
FIGS. 4A to 4F show various designs for the permanent magnet used to generate a magnetic field gradient in the practice of the invention.
Figure 4B:
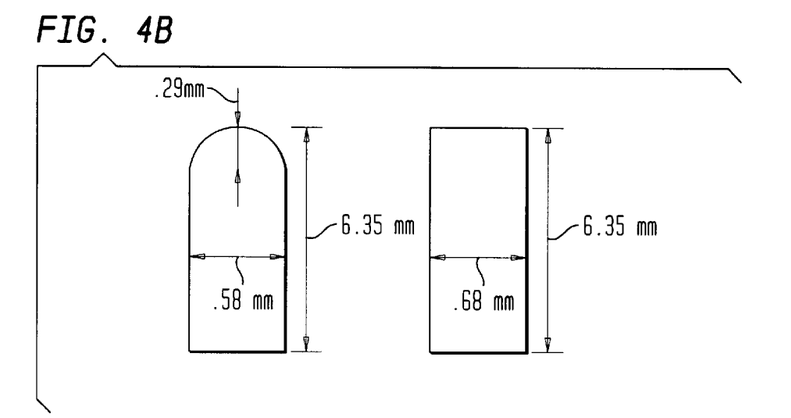
Figure 4C:
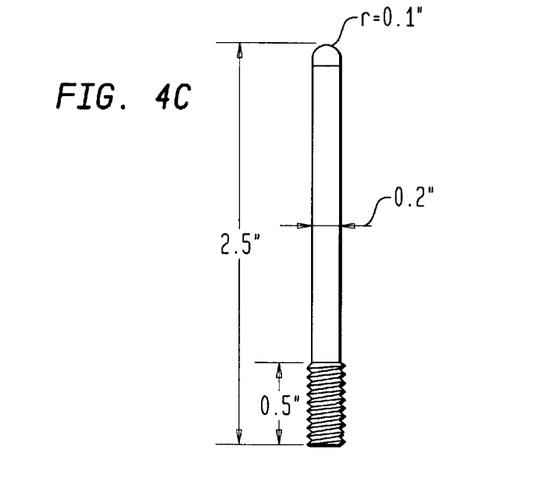
Figure 4D:
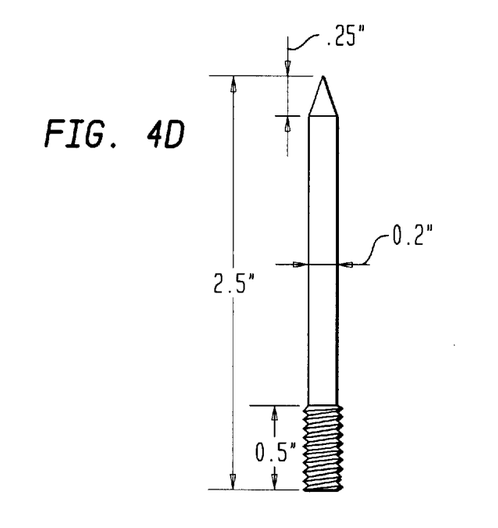
Figure 4E:
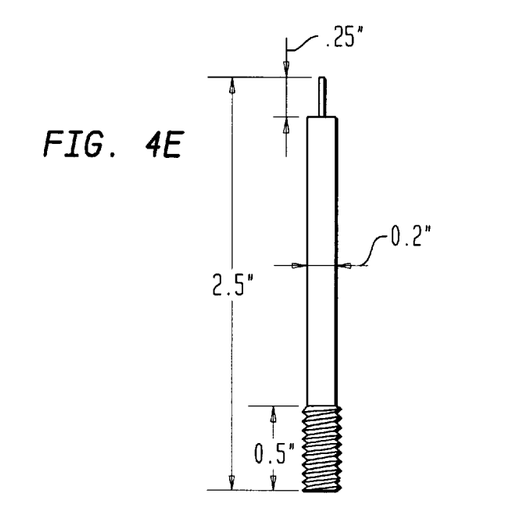
Figure 4F:
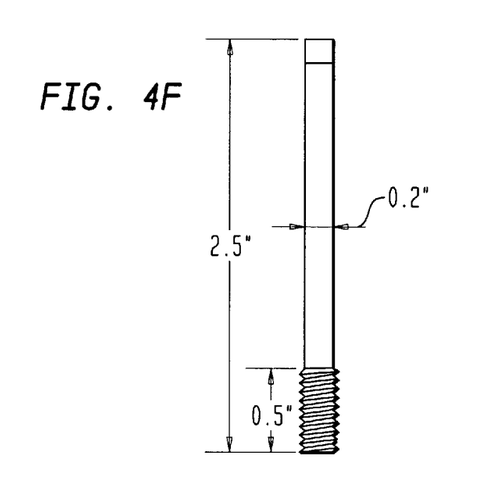

The magnetic field gradient is provided, in this embodiment, by a small bar magnet, specifically a NdFeB bar magnet. In a specific illustrative embodiment of the invention, magnetic material was obtained from Magnetic Component Engineering, Inc., Manitou Springs, Colo. (e.g., NdFeB Type N3871) and machined to the desired configuration. FIGS. 4A to 4F show various designs for the permanent magnet. It is advantageous to match the magnet to the sample in terms of geometry since the magnetic field gradient defines the plane of sensitivity. For example, a point source (FIG. 4E) is ideally suited for imaging proteins, whereas a flat source (FIG. 4F) is more suitable for imaging a biomimetic material wafer. FIG. 4A is a general all-purpose design.

Figure 5:
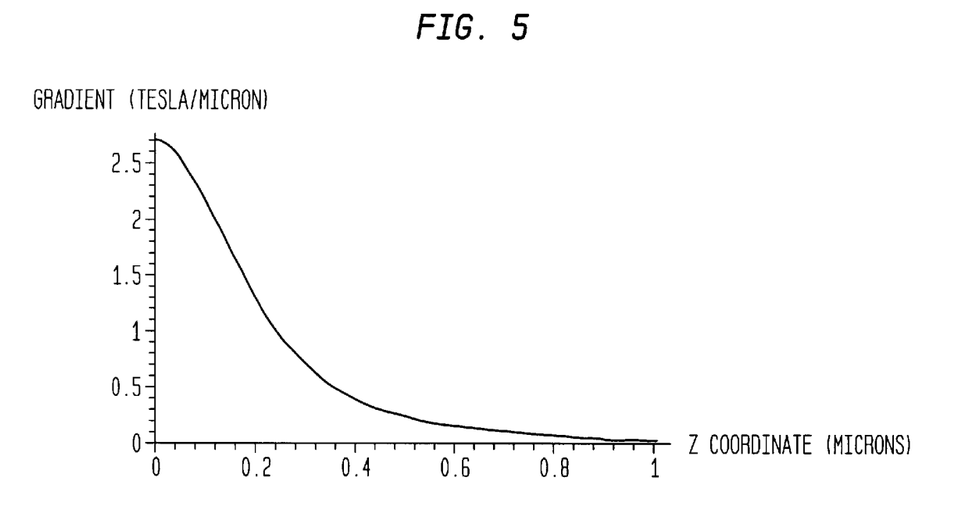
FIG. 5 is a graphical representation of the magnitude of the magnetic field gradient plotted as a function of the distance away from the end of a cylindrical NdFeB magnet having a diameter of 0.5 microns.

Of course, the largest available increase in sensitivity can be achieved by increasing the strength of the magnetic field gradient since the signal to noise ratio of an MRFM is directly proportional to the magnitude of the magnetic field gradient $\nabla B$. Large magnetic field gradients can be achieved by scaling down permanent magnets to very small dimensions. FIG. 5 is a graphical representation of the magnitude of the magnetic field gradient plotted as a function of the distance away from the end of a cylindrical NdFeB magnet having a diameter of 0.5 microns. An instrument with such sensitivity should be able to achieve nanometer scale resolution and would set the stage for investigations at the molecular level.

A permanent magnet, of the type illustratively shown in FIGS. 4A to 4F, is accommodated within an electromagnet that is the source of the time dependent magnetic field. In a practical embodiment, a cylindrical casing (2.5 inches in diameter by 1.5 inches long), made of iron contains the electromagnet windings. Specifically, the magnet windings are of 26 gauge soft copper magnet wire wound around an iron "C" core having a 1 inch diameter. The OD of the electromagnet windings with the casing is 2 inches. The casing has a tapped hole in the center to accommodate to the permanent magnet. The electromagnet performance is approximately 0.7 T at 4 amps. The magnet is housed in the MRFM apparatus within a 25 pound copper block heat sink with approximate dimensions of 12 inches tall, 8 inches wide and 1.5 inches thick.

In addition to the foregoing, the MRFM is placed in a vacuum chamber to avoid losses in cantilever Q. Referring to FIG. 2, the vacuum chamber consists of a steel plate (1 inch thick) on which is mounted a steel feedthrough collar (18 inches in diameter) with eight ports (both quick flange and kf type). The ports allow for the various wiring connections, fiber optic, vacuum, and other instrumentation and control lines required to control the MRFM components. On top of the steel feedthrough collar is a glass or steel bell jar (30 inches in height with a bottom diameter matching the feedthrough collar). A turbo-molecular vacuum pump backed by a roughing pump is utilized to pull a vacuum in the chamber. The pumps are connected to the chamber via a special accordion-type hose to minimize vibration transmission from the pump to the chamber.

Figure 6:
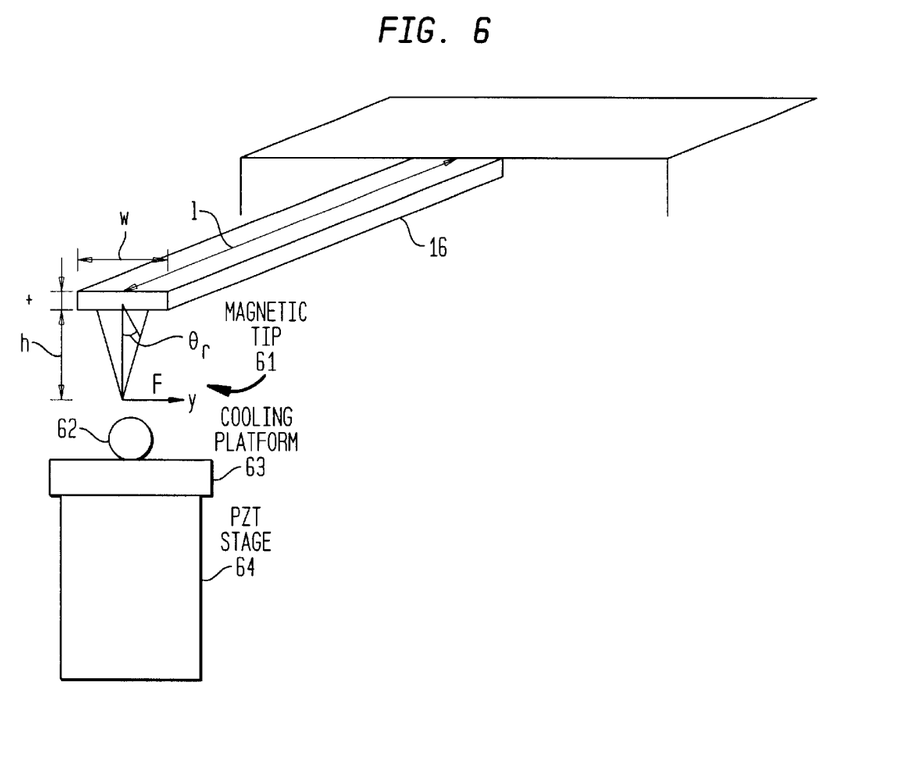
FIG. 6 is a schematic diagram of another embodiment of a MRFM having a scanning stage for mounting a sample, illustratively a biological sample.

In some embodiments, the MRFM operates at room temperature. However, certain advantages may be obtained by operating the MRFM at cryogenic temperatures. In the cryogenic embodiments, liquid helium cold finger stages, for example, may be employed to cool the sample and detection system. In a specific preferred embodiment, the cooling system consists of a liquid nitrogen temperature (77° K) copper cold finger which is physically attached to the cooled sample stage, as shown in FIG. 6, and connected to a liquid nitrogen bath outside of the vacuum chamber. By decreasing the temperature of the mechanical oscillator and the sample under investigation, the sensitivity increases two ways: reduction of the thermal noise of the oscillator (1√T) and the increase of the net polarization of the spins (1/T). In the cooled embodiments, approximately 0.1 micron resolution can be achieved.

FIG. 6 is a schematic diagram of another embodiment of a MRFM having a scanning stage for mounting a sample, illustratively a biological sample. In this embodiment, the permanent magnet to provide the necessary field gradient is attached to the micromechanical resonator and is scanned above the sample surface. Referring to FIG. 6, cantilever 16 has a magnetic tip 61. Suitable cantilevers with a magnetic tip can be purchased from Nanosensors, GmBH and Co. Sample 62 is affixed to platform 63, which is preferably a cooling platform. Platform 63 is located on a translatable piezoelectric stage 64. Placing the sample on a translatable cold stage allows for easy affixation of the sample to the stage and for facile switching to another sample.

Figure 7:
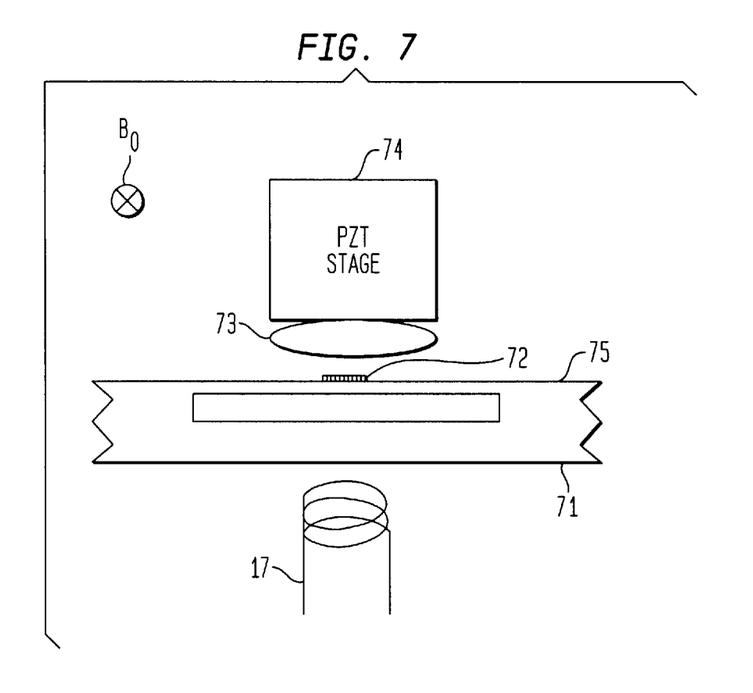
FIG. 7 is an illustrative embodiment of a MRFM using a guitar string-type resonator.

In yet another preferred embodiment, the micromechanical resonator, or oscillator, may be a guitar string-type resonator as shown in FIG. 7. In this illustrative embodiment, the entire resonator structure is contained on a silicon wafer 71. The "guitar string" cantilever beam 75 is a 100 microns long by 3 microns wide and 0.2 microns thick. A magnetic film 72 is deposited on the cantilever surface by a deposition technique, such as chemical vapor deposition. Resonant frequency is 0.1 to 5 MHz, with a Q of approximately $10^6$, and spring constant of 0.03 N/m. The magnetic field gradient produced from the film is about $10^5$ to $10^6$ T/m. Thus, the permanent magnet is attached to the micromechanical oscillator which is positioned directly below the sample of interest. Referring to FIG. 7, sample 73 is mounted on a translatable stage 74 which scans by piezoelectric elements. Placing biological samples on a stage is more convenient than laboriously mounting such samples on the cantilever. Further, the stage can be cooled to physically adhere samples by freezing.

The minimum estimated resolution achievable with a device of the type shown in FIG. 7 will be on the order of 100 nm in all three dimensions. In contrast, the optimum resolution achieved by conventional magnetic resonance techniques is 10 microns.

Preparation of Biological Samples

In order to prepare an illustrative biological sample, a paramagnetic agent is incorporated into a cell by endocytosis. In a specific preferred embodiment, the paramagnetic agent is a particular type of coal char that can be found in South Wales, UK, known as gloxy. This paramagnetic agent is oxygen sensitive and has been well characterized in the art. See, for example, James, "Gloxy: An oxygen-sensitive coal for accurate measurement of low oxygen tensions in biological systems," *Magnetic Resonance in Medicine,* Vol. 38, pp. 48–58 (1997). Gloxy can easily be detected via (electron) magnetic resonance. Advantageously, gloxy can be added to a culture medium and incorporated into biological cells without being toxic. The electron paramagnetic resonance (EPR; or equivalently electron spin resonance) signal characteristics of gloxy are dependent on the level of oxygen available to the molecule.

Of course, other paramagnetic materials could be used as dopants in the practice of the invention. In general, these dopants for electron magnetic resonance are organic molecule with an unpaired electronic spin. Several illustrative examples include, but are not limited to, diphenylpicrylhydrazyl and India ink.

For nuclear (as opposed to electron), magnetic resonance, a stable magnetic resonance visible nuclei can be used as a dopant, or to enrich or label a particular molecular site on a cellular receptor. For example, a C12 nuclei, which is MR invisible because it has no magnetic spin, in a particular location on a molecule or compound, may be replaced with a C13 nuclei, which is MR visible because it has a magnetic moment/spin, in order to obtain optimal signals from biological samples or to guide the operator to a particular location of interest on the biological sample under investigation. Another example would be the selective replace of O16 site with O17.

Experimental Data

In order to demonstrate the utility of the MRFM of the present invention (FIG. 2) for imaging a biological system, an experimental mouse tumor cell culture (EMT6) was doped with the paramagnetic agent, gloxy.

Cells were placed in a tissue culture dish with appropriate media and gloxy (50 to 100 micrograms/milliliter) was added. The culture dishes were placed in a standard $CO_2$ incubator (95% $O_2$/5% $CO_2$) maintained at 37° C. for 48 to 72 hours. The cultured cells were then fixed with ethanol to release cells from the bottom of the culture dish. Cells were pipetted into a centrifuge tube and centrifuged. The supernatant, containing culture media and free gloxy particles, was separated from the cells. Distilled water was added to wash the cells so as to remove the remaining unincorporated gloxy. The addition of water followed by centrifugation was repeated three times.

Figure 8A:
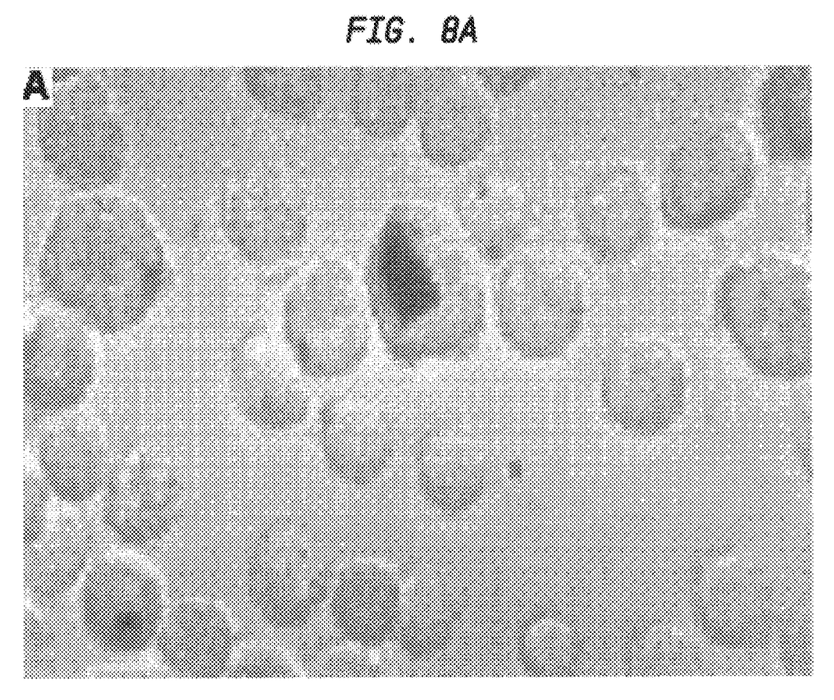
FIG. 8A is an image of a cell with a large amount of gloxy incorporated via endocytosis as identified under a light microscope.
Figure 8B:
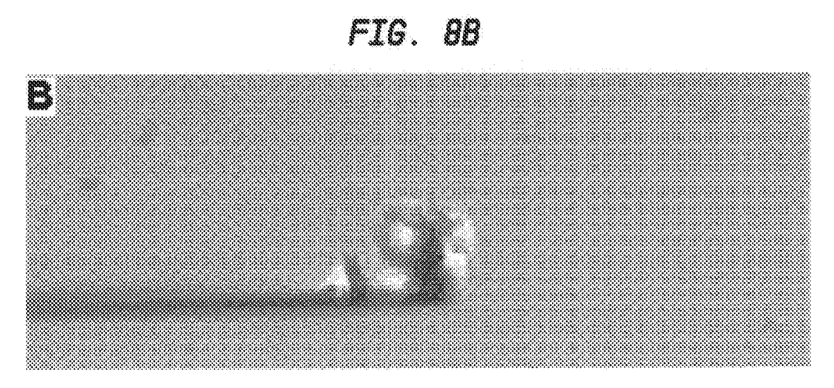
FIG. 8B is an image of the cell mounted on the tip of a force microscope cantilever.

After incubation, fixing, centrifugation, and washing, a cell with a large amount of gloxy incorporated via endocytosis was identified under a light microscope as shown in FIG. 8A. The cell with incorporated gloxy was then attached to the tip of a force microscope cantilever with a micropipette. FIG. 8B is an image of the cell mounted on the tip of the force microscope cantilever. For reference, cantilever dimensions, in this embodiment, are 450 μm in length, 30 μm in width and 2 μm in thickness. The cell self-adheres to the silicon cantilever. In embodiments where a cold sample stage is used, the cell can be mechanically attached by freezing in position on the sample stage.

Figure 9:
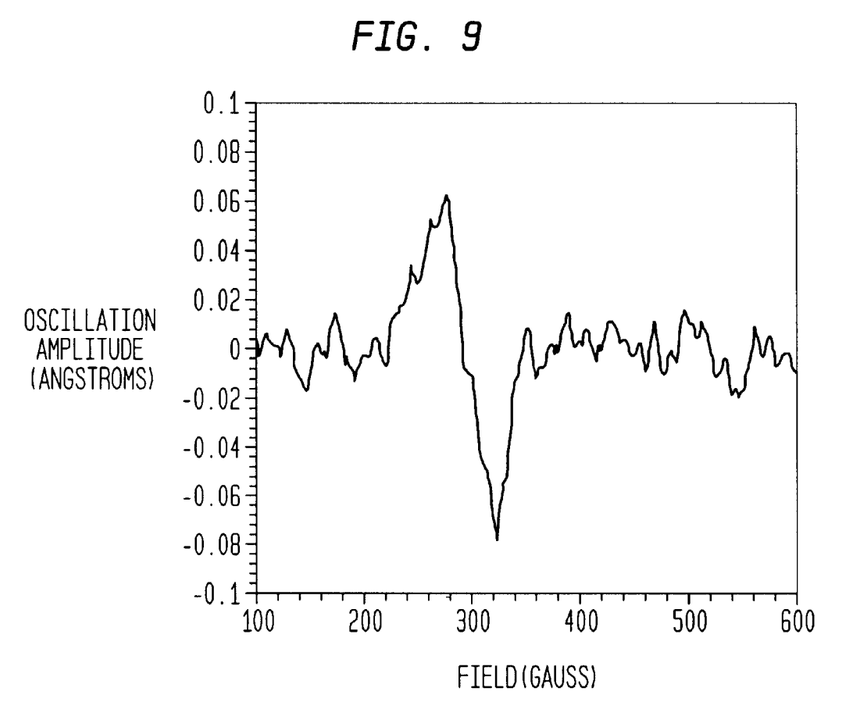
FIG. 9 is a tracing of the amplitude of the detected cantilever oscillation as a function of the applied magnetic field obtained in the MRFM of FIG. 2 for the cell shown in FIGS. 8A and 8B.

The mounted cell was scanned in the MRFM of the present invention. The MRFM signal from the gloxy particle, within this cell, is shown in FIG. 9. FIG. 9 is a tracing of the amplitude of the detected cantilever oscillation as a function of the applied magnetic field. The tracing of FIG. 9 is a one-dimensional profile of the sub-cellular structure containing the gloxy. With the observed linewidth of 43 Gauss, and a known field gradient of 2.6 Gauss/micron, the diameter of the particle is estimated to be 17 microns. This is in good agreement with the light microscope estimate of approximately 16 microns. Extrapolating from the slope of the MRFM signal, the resolution of this experiment is approximately 1 micron. Given an electron spin density of gloxy of $4.6 \times 10^{19}$ electron spins/gram, this experiment successfully detected a signal from an approximately 2 ng sample containing $9 \times 10^{10}$ electron spins. This may be the most sensitive detection of electron paramagnetic resonance at room temperature recorded to date and clearly demonstrates the feasibility of performing MRFM in a biological sample with sub-cellular resolution.

Although the invention has been described in terms of specific embodiments and applications, persons skilled in the art can, in light of this teaching, generate additional embodiments without exceeding the scope or departing from the spirit of the claimed invention. Accordingly, it is to be understood that the drawing and description in this disclosure are proffered to facilitate comprehension of the invention, and should not be construed to limit the scope thereof.

What is claimed is:

1. An apparatus for high resolution imaging of samples by mechanical detection of magnetic resonance, the apparatus comprising:

a mechanical oscillator having a natural frequency of oscillation;

a biological sample containing nuclear or electron spins, in proximity to the mechanical oscillator;

a first magnet for applying a large substantially time independent magnetic field gradient to said biological sample;

a second magnet for applying at least one oscillating magnetic field to said biological sample;

a detector for detecting low amplitude mechanical resonance signals from said biological sample.

2. The apparatus of claim 1 wherein said biological sample is affixed to said mechanical oscillator.

3. The apparatus of claim 2 wherein the magnetic field gradient applied by said first magnet is translatable with respect to said biological sample affixed to the mechanical oscillator.

4. The apparatus of claim 1 wherein said first magnet for applying a magnetic field gradient is affixed to the mechanical oscillator.

5. The apparatus of claim 4 wherein said mechanical oscillator and said biological sample are translatable relative to one another.

6. The apparatus of claim 1 further comprising a mounting stage for said biological sample in proximity to said mechanical oscillator.

7. The apparatus of claim 6 wherein said mounting stage is translatable in the x, y, and z directions.

8. The apparatus of claim 6 wherein said mounting stage has cooling platform.

9. The apparatus of claim 1 wherein said first magnet is a permanent magnet configured to have a geometry that matches that of said biological the sample.

10. The apparatus of claim 1 wherein said second magnet is an electromagnet.

11. The apparatus of claim 1 wherein said detector is an optical interferometer.

12. A method of imaging a biological sample by mechanical detection of magnetic resonance, the method comprising the steps of:

incorporating into the biological sample an agent for enhancing the ability of the mechanical resonance signals from said biological sample to be detected by said detector, whereby the biological sample contains nuclear or electron spins;

placing the biological sample containing nuclear or electron spins, in proximity to a mechanical oscillator having a natural frequency of oscillation;

applying a large substantially time independent magnetic field gradient to the biological sample;

applying at least one oscillating magnetic field to the biological sample; and detecting the low amplitude mechanical resonance signals from the biological sample.

13. The method of claim 12 further including the step of scanning to obtain a multi-dimensional image, said step of scanning including the further step of displacing the biological sample and the oscillator relative to one another.

14. The method of claim 12 wherein said step of incorporating comprises the further step of doping the biological sample with a paramagnetic agent.

15. The method of claim 14 wherein the paramagnetic agent is gloxy.

16. The method of claim 12 comprising the further step of incubating cells in a culture medium having a paramagnetic agent therein so as to incorporate the paramagnetic agent in the biological sample by endocytosis.

17. The method of claim 12 wherein said step of incorporating comprises the further step of doping the biological sample with stable NMR visible compounds 18. The method of claim 17 wherein the NMR visible compounds are selected from the group consisting of C13 and O17.

* * * * *